(12) United States Patent
Nakada

(10) Patent No.: US 6,368,898 B1
(45) Date of Patent: *Apr. 9, 2002

(54) SOLID-STATE IMAGE SENSING DEVICE

(75) Inventor: Shinichi Nakada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/510,619

(22) Filed: Feb. 22, 2000

Related U.S. Application Data

(63) Continuation of application No. 08/784,183, filed on Jan. 15, 1997, now Pat. No. 6,071,760.

(30) Foreign Application Priority Data

Jan. 17, 1996 (JP) .......................................... P08-023028

(51) Int. Cl.$^7$ .............................................. H01L 21/60
(52) U.S. Cl. ...................... 438/123; 438/116; 438/124; 438/126; 438/127
(58) Field of Search .......................... 438/69, 121, 123, 438/FOR 377, FOR 80, 116, 125, 124, 127, 126; 257/434, 680, 704, 433, 787; 174/52.1, 52.2, 52.3, FOR 124–126

(56) References Cited

U.S. PATENT DOCUMENTS 5,321,204 A  6/1994  Ko
5,357,056 A  10/1994  Nagano
5,534,725 A  7/1996  Hur
5,773,323 A  6/1998  Hur
5,786,589 A  7/1998  Segawa et al.
6,071,760 A * 6/2000  Nakada ...................... 438/123

FOREIGN PATENT DOCUMENTS

| JP | 56-69842 | 6/1981 |
|---|---|---|
| JP | 63-213373 | 9/1988 |
| JP | 63-240078 | 10/1988 |
| JP | 63-274162 | 11/1988 |
| JP | 02-101776 | 4/1990 |
| JP | 02-103967 | 4/1990 |

* cited by examiner

*Primary Examiner*—Olik Chaudhuri
*Assistant Examiner*—Alonzo Chambliss
(74) *Attorney, Agent, or Firm*—Sonnenschein, Nath & Rosenthal

(57) ABSTRACT

There is provided a solid-state image sensing device, having: a semiconductor chip having an effective area used for image sensing; a sealing plate provided opposedly to the semiconductor chip; inner leads arranged between an outside portion of the effective area of the semiconductor chip and the sealing plate, and connected electrically to the semiconductor chip; and a sealant in contact with the end portion and the side face on the effective area side of the inner leads.

8 Claims, 3 Drawing Sheets

SOLID-STATE IMAGE SENSING DEVICE

RELATED APPLICATION DATA

This application is a continuation of U.S. application Ser. No. 08/784,183 filed Jan. 15, 1997, Attorney Docket No. P96,2925 now U.S. Pat. No. 6,071,760. The present and foregoing applications claim priority of Japanese application No. P08-784,183 filed Jan. 15, 1996. All of the foregoing applications are incorporated herein by reference to the extent permitted by law.

BACKGROUND OF THE INVENTION

1. Field of the Invention

The present invention relates to a solid-state image sensing device, in which, in a charge coupled device (CCD) solid-state image sensing device for instance, inner leads from a semiconductor chip are formed by means of tape automated bonding (TAB), and positional dislocation of the semiconductor chip with respect to a lid is reduced by applying a sealant so as to include end portions on the side of an effective area of the inner leads when a surface of the semiconductor chip is sealed with the lid.

2. Description of Related Art

Conventionally, in a process of manufacturing a CCD solid-state image sensing device or the like, a lid is adhered to a chip surface so as to seal the chip surface, thereby to form a CCD solid-state image sensing device. With this, in this manufacturing process, a front face of an effective area used for image sensing by the CCD solid-state image sensing device is held in the air by a lid, thereby to evade lowering of sensitivity of the portion in the air caused by the change of a refractive index effectively.

Namely, FIGS. 2A to 2C show sectional views showing a CCD solid-state image sensing device in one process of manufacturing a semiconductor, and a chip surface of a semiconductor chip 2 is sealed in a CCD solid-state image sensing device 1 in this process. Here, the semiconductor chip 2 is formed in an almost rectangular configuration, an effective area 7 used for image sensing is formed at almost the center thereof, and electrodes or the like are formed around this effective area. In this semiconductor chip 2, bumps 4 are formed on the electrodes around thereof in a preliminary process (FIG. 2A), and inner leads 5 by TAB are connected to respective electrodes through these bumps 4.

A lid 3 is formed of a transparent member such as a glass plate against the semiconductor chip 2, and a sealant 6 is applied around the effective area 7 of the semiconductor chip 2 so that the sealant does not penetrate into this effective area and also does not adhere to the inner leads 5. Here, the sealant 6 is formed of half-hardened epoxy resin or the like so that the sealant 6 is not applied to the lid 3 and does not flow.

Furthermore, after the lid 3 is placed upon the semiconductor chip 2 in succession (FIG. 2B) in an atmosphere of inert gas such as nitrogen gas, the sealant 6 is hardened by thermosetting under a state that predetermined pressure F is applied, thereby to seal the chip surface of the semiconductor chip 2. With this, the CCD solid-state image sensing device 1 is shipped through an inspection process or the like.

Now, even when epoxy resin or the like which has been half-hardened so that it is not applied to the lid 3 and does not flow is applied as the sealant 6, the sealant 6 is lowered in the viscosity and becomes liable to flow at time of thermosetting. Thus, there has been such a problem that the lid 3 becomes liable to move thus causing positional dislocation in the case of thermosetting due to lowering of the viscosity of the sealant 6 in a conventional solid-state image sensing device 1.

In a CCD solid-state image sensing device, when the lid 3 slips out of place at a tolerance or more, the external configuration becomes to exceed a rated value when packaging is made. Further, the sealant 6 becomes to swell out to the effective area 7 in keeping with positional dislocation of the lid 3, the usable between area 7 is decreased by that portion and the reliability is also lowered.

SUMMARY OF THE INVENTION

The present invention has been made taking the above-mentioned points into consideration, and is going to propose a solid-state image sensing device which is capable of reducing positional dislocation of the lid at time of thermosetting.

In order to solve such subjects, there is provided, according to the present invention, a solid-state image sensing device, having: a semiconductor chip having an effective area used for image sensing; a sealing plate provided opposedly to the semiconductor chip; inner leads arranged between an outside portion of the effective area of the semiconductor chip and the sealing plate, and connected electrically to the semiconductor chip; and a sealant in contact with the end portion and the side face on the effective area side of the inner leads.

By these means, when a sealant is applied so as to include the end portions of the inner leads on the effective area side of the semiconductor chip, it is possible to disturb the flow of the sealant by the inner leads and to prevent the movement of the lid even when the viscosity of the sealant is lowered when the sealant is hardened.

DESCRIPTION OF THE PREFERRED EMBODIMENTS

Figure 1A:
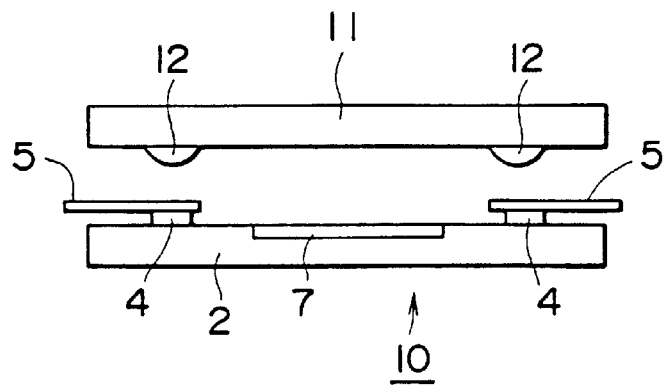
FIGS. 1A to 1C show sectional views showing a CCD solid-state image sensing device according to an embodiment of the present invention.

An embodiment of the present invention will be described in detail hereinafter while referring to the drawings according to circumstances.

Figure 1B:
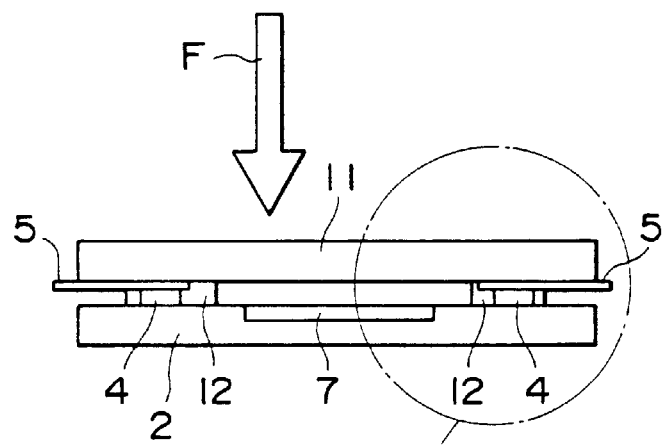
Figure 1C:
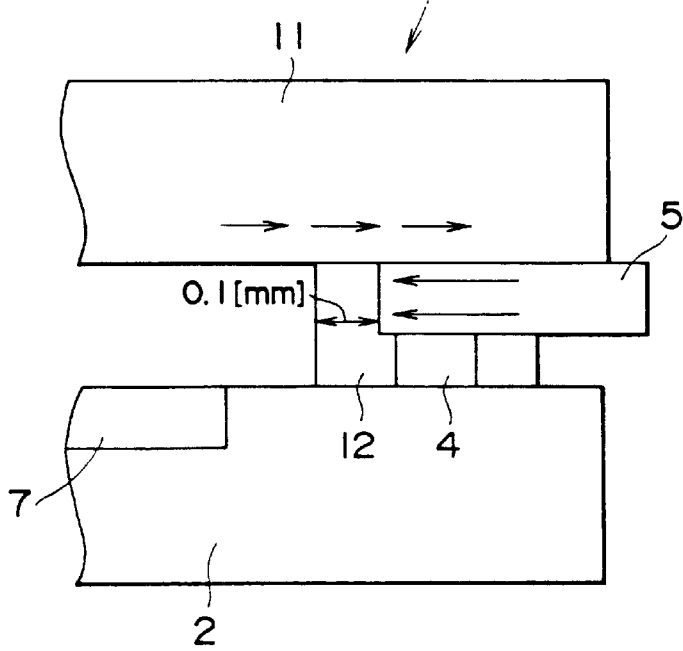
Figure 2A:
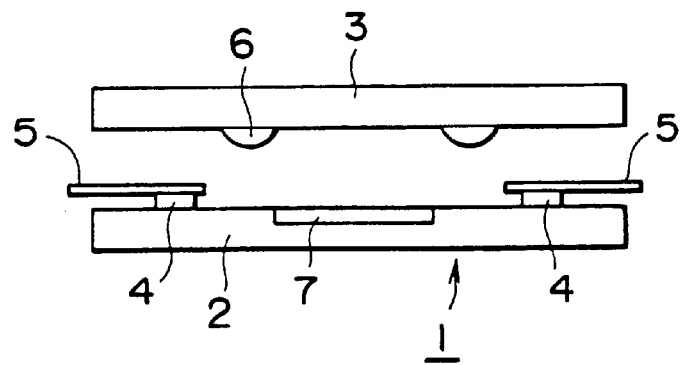
FIGS. 2A to 2C show sectional views showing a conventional CCD solid-state image sensing device corresponding to FIGS. 1A to 1C.
Figure 2B:
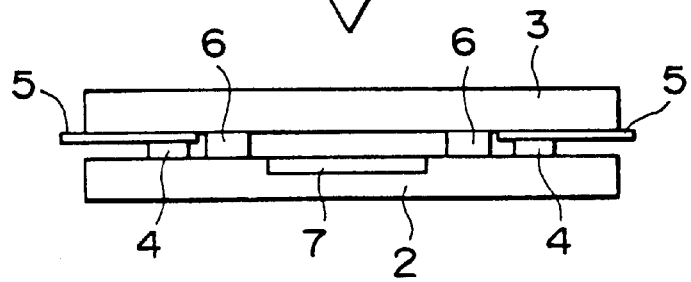
Figure 2C:
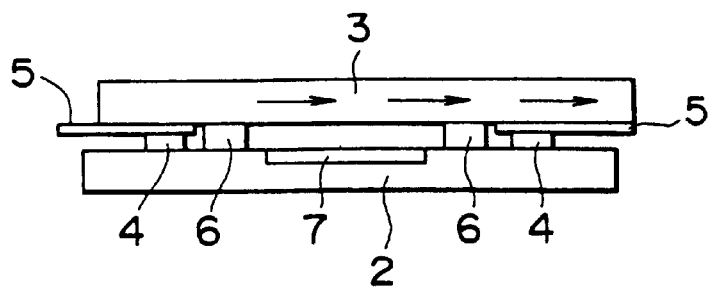

FIGS. 1A to 1C show sectional views showing a CCD solid-state image sensing device comprising to an embodiment of the present invention through comparison with FIGS. 2A to 2C. In FIGS. 1A to 1C, the same structure as FIGS. 2A to 2C is shown by affixing corresponding reference numerals, and duplicated description thereof will be omitted.

Namely, in a semiconductor chip 2, inner leads 5 are formed by TAB and a lid 11 is adhered thereby to seal a chip surface similarly to a conventional CCD solid-state image sensing device. Here, the lid 11 is formed of a glass plate, and a sealant 12 composed of half-hardened epoxy resin (i.e., B stage sealer for sealing) is applied in a frame shape. Since the viscosity of the half-hardened epoxy resin is hard to be lowered, the positional dislocation of the lid 11 is controlled.

Figure 3:
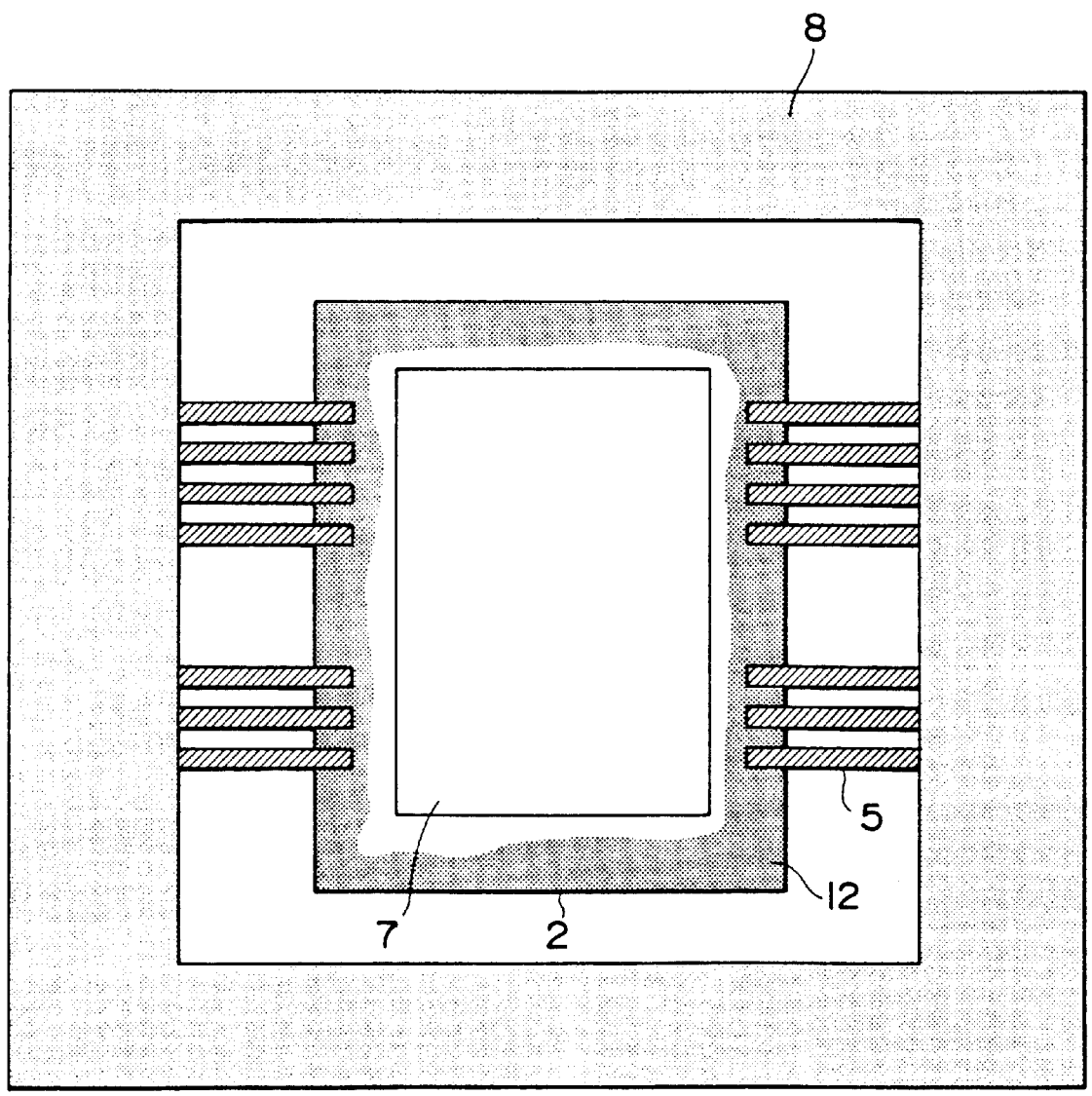
FIG. 3 is a plan view showing a CCD solid-state image sensing device according to an embodiment of the present invention.

At this time, the sealant 12 has been heretofore applied to the outside so that the sealant 12 bulges out slightly on the effective area 7 side from the end portions of the inner leads 5 on the effective area 7 side when the lid 11 is placed upon the semiconductor chip 2 (FIG. 1A). To be concrete, the sealant 12 is applied to the lid 11 so as to cover the bumps 4 completely and to bulge out inside by 0.1 [mm] on the effective area 7 side from the end portions on the effective area 7 side of the inner leads 5 in internal and external circumference directions, and so as to cross the inner leads 5 completely in the direction along the outer circumference of the semiconductor chip (FIG. 1C). FIG. 3 is a plan view of a solid-state image sensor device after the semiconductor chip 2 is sealed with the lid 3. Corresponding reference numerals are affixed to those parts that are the same as the parts shown in FIG. 1. A reference numeral 8 represents a polyimide tape.

With this, in the present embodiment, even when the viscosity of the sealant 12 is lowered and the sealant 12 becomes easier to flow, the flow of the sealant 12 is disturbed principally by the resistance from the end portions on the effective area side of the inner leads 5 with respect to the direction of extension of the inner leads 5 and principally by the resistance from the sides of the inner leads 5 with respect to the direction of crossing the inner leads 5.

Then, the lid 11 is housed in an oven after it is placed on the semiconductor chip 2 and in a state that pressure application F at approximately 0.2 to 1.0 [Kg] is received, and the sealant 12 is thermo-hardened (FIG. 1B). Besides, this thermosetting is executed within the range of 130 to 150 degrees and 1 to 5 hours by means of a preset profile in the present embodiment. With this, the lid 11 is adhered to the semiconductor chip 2 at the sealing width of 0.2 [mm] and the gap quantity of 0.05 [mm], thereby to seal the chip surface.

With this, the semiconductor chip 2 is formed into a finished product through an inspection process after being packaged in a successive process.

In a CCD solid-state image sensing device 10 in the above-mentioned structure, the lid 11 is adhered to the inner leads 5 by thermosetting of the sealant 12 after the inner leads 5 by TAB are formed on the semiconductor chip 2 through the bumps 4, thus sealing the chip surface.

At this time, in the CCD solid-state image sensing device 10, the sealant 12 is applied so that the sealant 12 covers the bumps 4 completely and bulges out inside from the end portions on the effective area 7 side of the inner leads 5 with respect to inner and outer circumferential directions and the sealant 12 crosses the inner leads 5 completely with respect to the direction along the outer circumference of the semiconductor chip 2, thereby to disturb the flow of the sealant 12 principally by the resistance from the end portions on the effective area 7 side of the inner leads 5 with respect to the direction of the extension of the inner leads 5 and principally by the resistance from the sides of the inner leads 5 with respect to the direction of crossing the inner leads, thus reducing positional dislocation of the lid 11 at time of thermosetting.

Besides, according to the results of confirmation, it has been comprehended that it is possible to reduce the positional dislocation of the lid 11 which has been approximately ±0.1 [mm] in the case of a conventional application method to approximately ±10 [μm] in the present embodiment, and to reduce the positional dislocation markedly.

According to the structure described above, by applying the sealant 12 so as to cover the bumps 4 completely and to bulge out inside from the end portions on the effective area 7 side of the inner leads 5 with respect to inner and outer circumferential directions and so as to cross the inner leads 5 completely with respect to the direction along the outer circumference of the semiconductor chip 2, it is possible to disturb the flow of the sealant 12 by means of the inner leads 5, thereby to reduce positional dislocation of the lid 11 at time of thermosetting.

Accordingly, it is possible to reduce inferiority of an external configuration thereby to improve yield, it is possible to effectively evade reduction of usable effective area by reducing bulging out of the sealant 12 into the effective area, and further, it is also possible to improve the reliability. Furthermore, it is possible to miniaturize the package by the portion that the positional dislocation is reduced.

Besides, in the embodiment described above, a case that the sealant 12 is applied so as to cover the bumps 4 completely and to bulge out inside from the end portions on the effective area 7 side of the inner leads 5 with respect to the inner and outer circumferential directions and so as to cross the inner leads 5 completely with respect to the direction along the outer circumference of the semiconductor chip 2 has been described, but, the present invention is not limited thereto. In a work, when the sealant is applied so as to include the end portions on the effective area 7 side of the inner leads 5, it is possible to disturb the flow of the sealant by the end faces and the side faces of these end portions. Thus, it may also be arranged so that the sealing width is reduced so that the bumps 4 are not covered completely.

Further, in the embodiment described above, a case that the sealant is applied with thermosetting by being housed in an oven has been described. However, the present invention is not limited thereto, but hardening may be made by column cure, and in this case, hardening can be made under the condition of 150 to 160 degrees at the sealing surface and two to five minutes.

Furthermore, in the embodiment described above, a case that thermosetting is applied to half-hardened epoxy resin so as to conduct sealing has been described. However, the present invention is not limited thereto, but it can be applied widely to a case of sealing with various adhesives such as a case that epoxy resin in a liquid form is applied with thermosetting so as to conduct sealing, and furthermore, a case that sealing is conducted with adhesives of an ultraviolet hardening type.

As described above, according to the present invention, when a lid is adhered to a semiconductor chip in which inner leads are formed by TAB, it is possible to disturb the flow of the sealant with the inner leads by applying the sealant so as to include the end portions on the effective area side of the semiconductor chip of the inner leads, thus reducing the positional dislocation of the lid.

What is claimed is:

1. A method of manufacturing a solid-state image sensing device, comprising the steps of:

connecting inner leads to a semiconductor chip having an effective imaging area; and joining a sealing plate opposite the effective imaging area of said semiconductor chip with said inner leads therebetween;

wherein a sealant is formed so as to encapsulate an end portion and a side face of said inner leads outside of an effective imaging area side of said inner leads, the sealant is formed to bulge out from the end portion toward the effective imaging area while leaving said effective area resin-free.

2. A method of manufacturing a sold-state image sensing device according to claim 1, wherein said inner leads are formed by TAB.

3. A method of manufacturing a solid-state image sensing device according to claim 1, wherein said sealant is half-hardened resin.

4. A method of manufacturing a solid-state image sensing device according to claim 3, wherein said resin is epoxy resin.

5. A method of manufacturing a solid-state image sensing device in which a semiconductor chip is sealed with a sealing plate, comprising the steps of:

connecting inner leads to a semiconductor chip having an effective imaging area;

attaching a sealing plate having a sealant at a position corresponding to end portions of said inner leads outside of an effective imaging area side of said inner leads, the sealant encapsulating the end portions and bulging out from the end portions toward the effective imaging area while leaving said effective imaging area resin-free; and thermosetting said sealant in a state that said sealing plate is placed on said semiconductor chip with said sealant in contact with the end portions of the leads.

6. A method of manufacturing a solid-state image sensing device according to claim 5, wherein said inner leads are formed by TAB.

7. A method of manufacturing a solid-state image sensing device according to claim 5, wherein said sealant applied to said sealing plate is half-hardened resin.

8. A method of manufacturing a solid-state image sensing device according to claim 7, wherein said resin is epoxy resin.

* * * * *